United States Patent
Koh et al.

(10) Patent No.: US 8,258,880 B2
(45) Date of Patent: Sep. 4, 2012

(54) RING OSCILLATOR FOR PROVIDING CONSTANT OSCILLATION FREQUENCY

(75) Inventors: Chin Yeong Koh, Singapore (SG); Kar Ming Yong, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 12/713,326

(22) Filed: Feb. 26, 2010

(65) Prior Publication Data

US 2011/0210798 A1  Sep. 1, 2011

(51) Int. Cl.
H03L 7/099 (2006.01)
H03L 1/00 (2006.01)

(52) U.S. Cl. ............. 331/34; 331/57; 331/185; 331/176
(58) Field of Classification Search ............... 331/57, 331/66, 176, 185, 186
See application file for complete search history.

(56) References Cited

U.S. PATENT DOCUMENTS

| | | | |
|---|---|---|---|
| 4,519,086 A | 5/1985 | Hull et al. | |
| 5,559,476 A | 9/1996 | Zhang et al. | |
| 5,638,030 A * | 6/1997 | Du ................................ 331/57 | |
| 5,760,657 A | 6/1998 | Johnson | |
| 6,157,231 A | 12/2000 | Wasson | |
| 6,985,040 B2 * | 1/2006 | Kim .............................. 331/16 |
| 7,629,856 B2 | 12/2009 | Thaller | |
| 2007/0152764 A1 * | 7/2007 | Lin ................................. 331/57 |
| 2008/0061893 A1 * | 3/2008 | Lakshmikumar et al. ...... 331/57 |
| 2008/0061983 A1 | 3/2008 | Dokai et al. | |
| 2008/0111638 A1 | 5/2008 | Thaller | |
| 2009/0051443 A1 * | 2/2009 | Illegems et al. ................. 331/57 |

FOREIGN PATENT DOCUMENTS

DE 102007047458 A1 5/2008

OTHER PUBLICATIONS

Hambley, "Electrical Engineering: Principles and Applications", 2nd edition, 2002, p. 529.*

* cited by examiner

*Primary Examiner* — Ryan Johnson
(74) *Attorney, Agent, or Firm* — Eschweiler & Associates, LLC

(57) ABSTRACT

Some embodiments disclosed herein relate to techniques for providing a relatively constant oscillation frequency. In some instances, these techniques can make use of a ring oscillator that is powered by an adaptive voltage supply. The adaptive voltage supply provides a temperature-dependent supply voltage to respective delay elements in the ring oscillator, such that the oscillation frequency of the ring oscillator is approximately constant over a predetermined temperature range. For example, if temperature increases, the supply voltage can be increased proportionally, thereby tending to limit variation in the oscillation frequency delivered by the ring oscillator.

10 Claims, 4 Drawing Sheets

RING OSCILLATOR FOR PROVIDING CONSTANT OSCILLATION FREQUENCY

Built-in relaxation oscillators that make use of a ring oscillator are gaining popularity for applications that do not require a very precise clock frequency. This increase in popularity is due, in part, to their cost savings and reduced number of pins, which can stem from the fact that no external crystal oscillator is required.

FIG. 1 shows an example of a conventional ring oscillator 100, which includes an odd number of inverters 102 (e.g., 102a, 102b, 102c). The inverters 102 are chained together such that the output of the last inverter (e.g., 102c) feeds back to the input of the first inverter (e.g., 102a). Because each inverter "flips" data from its input to its output (e.g., from a "0" to a "1", or vice versa), the odd number of inverters in the ring oscillator causes the output of each inverter to vary between a high state and a low state in alternating fashion according to an oscillation frequency $f_{osc}$.

Although ring oscillators can, in general, provide such an oscillation frequency, conventional ring oscillators are unable to deliver a reliable oscillation frequency that is constant over a wide range of temperatures. For example, for each transistor making up an inverter, the mobility of carriers (e.g., electrons and/or holes) in the semiconductor substrate changes inversely with temperature. Thus, as the temperature increases, the mobility of the carriers decreases, thereby increasing the switching time of each transistor and tending to decrease the overall oscillation frequency of the ring oscillator.

Further, even at the same temperature, the frequency of one ring oscillator may differ from that of another intended-to-be-identical ring-oscillator, due to statistical variations in the manufacturing process used to make these ring oscillators. These manufacturing variations often resemble a normal or Gaussian distribution. More particularly, because there are two types of transistors in a CMOS process (NMOS and PMOS transistors), a manufacturing process can be characterized by four different corners denoted as fast-fast (FF), slow-slow (SS), fast-slow (FS), slow-fast (SF) (as well as a central typical-typical region), as illustrated in FIG. 2. Because transistors formed by a given manufacturing process can fall anywhere within the four process corners shown in FIG. 2, ring oscillators created by the manufacturing process vary slightly from one another. For example, if a first ring oscillator has more SS transistors than a second ring oscillator, the first ring oscillator generally tends to have a lower oscillation frequency than the second ring oscillator.

In view of these considerations, conventional ring oscillators have been unable to deliver a substantially constant oscillation frequency due to frequency variations caused by temperature and manufacturing variations. Therefore, aspects of the present disclosure are directed towards improved ring oscillators that are capable of achieving this type of substantially constant oscillation frequency.

DETAILED DESCRIPTION

Figure 1:
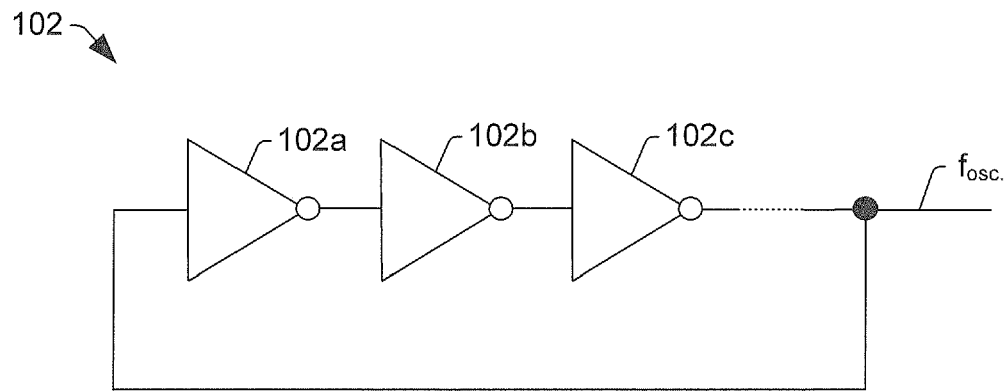
FIG. 1 is a functional diagram of a conventional ring oscillator.
Figure 2:
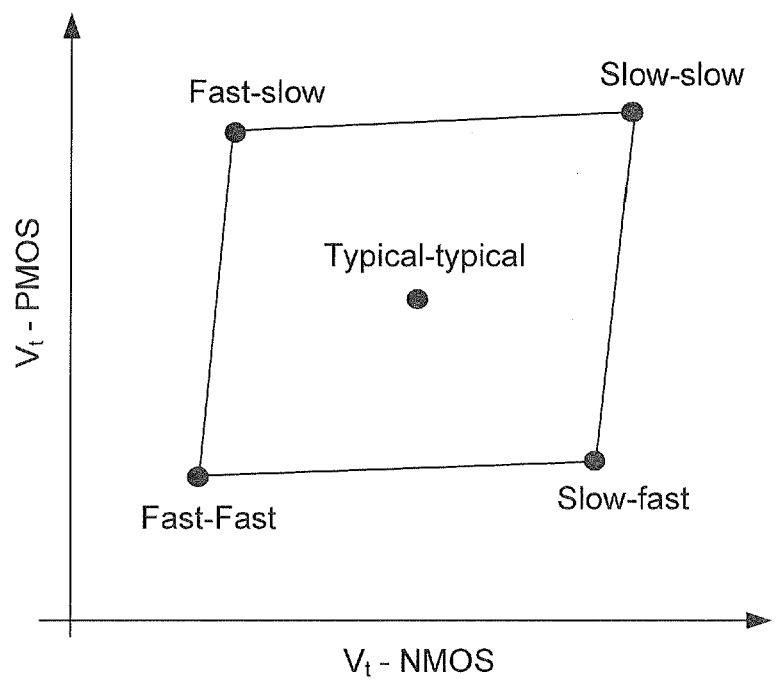
FIG. 2 is a graph illustrating a range of operating characteristics of a number of transistors over a manufacturing process, wherein the different operating characteristics are due to manufacturing variations in the transistors.

Ring oscillator implementations are now described with reference to the drawings, wherein like reference numerals are used to refer to like elements throughout. In the following description, for purposes of explanation, numerous specific details are set forth in order to provide a thorough understanding of these ring oscillator implementations. It will be appreciated, however, that the claimed implementations may be practiced without these specific details.

In view of the shortcomings of conventional ring oscillators, the inventors have devised improved techniques for providing a relatively constant oscillation frequency. As will be appreciated in greater detail below, these techniques often make use of a ring oscillator that is powered by an adaptive voltage supply. The adaptive voltage supply provides a temperature-dependent supply voltage to respective delay elements in the ring oscillator, such that the oscillation frequency of the ring oscillator is approximately constant over a predetermined temperature range. For example, in one embodiment where the oscillating frequency is around 350 MHz, the frequency variation can be limited to about +/−10 MHz over a temperature range of about −40° C. to about 130° C.

Figure 3:
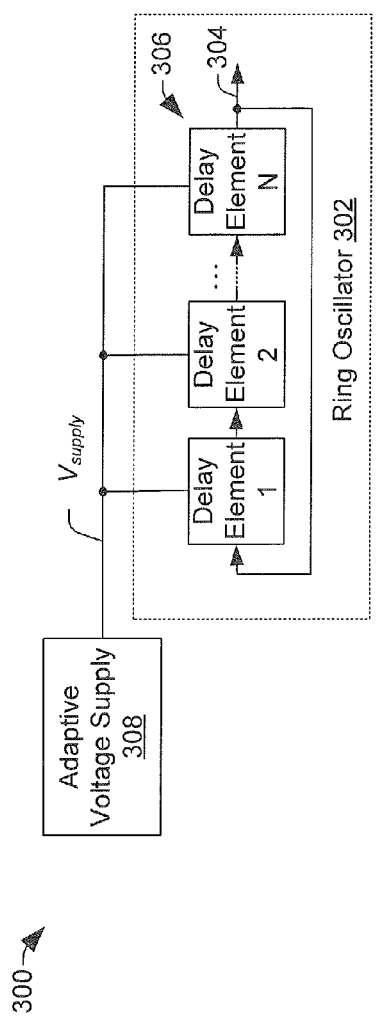
FIG. 3 is a block diagram illustrating a frequency generator in accordance with some embodiments.

Turning now to FIG. 3, one can see a frequency generator 300 in accordance with some embodiments. The frequency generator 300 comprises a ring-oscillator 302, which has an output 304 configured to provide an oscillating voltage having an oscillation frequency, $f_{osc}$. The frequency generator 300 includes an odd number, N, of delay elements 306 that are chained together so the output of the Nth delay element is coupled back to the input of the first delay element. If no countermeasures were to be taken, the oscillation frequency, $f_{osc}$, at the output 304 would tend to change as a function of temperature, due to a change in carrier-mobility with respect to temperature.

To prevent or limit this undesired change in oscillation frequency, the frequency generator 300 includes an adaptive voltage supply 308. The adaptive voltage supply 308 provides a temperature-dependent supply voltage $V_{supply}$ to the respective delay elements 306 to offset the change in carrier mobility due to changes in temperature.

In one example, the oscillation period, $T_p$, of the ring oscillator can be provided by equation (1) below:

$$T_p = N(T_{PLH} + T_{PHL}) \quad (1)$$

where N represents the number of delay elements in the ring oscillator, and $T_{PLH}$ and $T_{PHL}$ represent the low-to-high and high-to-low transition delays, respectively, for individual delay elements. Assuming a step input and negligible non-ideal effects such as channel length modulation, $T_{PLH}$ and $T_{PHL}$ of a single delay element can be provided by equations (2) and (3) below:

$$T_{PHL} \sim 2C_L \times V_{TN}/K_N(V_{Supply} - V_{TN})^2 \quad (2)$$

$$T_{PLH} \sim -2C_L \times V_{TP}/K_P(V_{Supply} + V_{TP})^2 \quad (3)$$

where $K_N = \mu_N C_{OX}(W/L)_N$ and $K_P = \mu_P C_{OX}(W/L)_P$ are the transconductance parameters of NMOS and PMOS transistors, respectively; $V_{TN}$ and $V_{TP}$ are threshold voltages of NMOS and PMOS transistors, respectively; and $C_L$ is the effective load of the delay element.

Because the mobilities $\mu_N$ and $\mu_P$ vary inversely with respect to temperature, the adaptive voltage supply 308 is configured to vary the supply voltage $V_{supply}$ proportionally with temperature, thereby compensating for the temperature dependence of these mobilities. For example, if the temperature increases, the supply voltage $V_{supply}$ is increased proportionally to offset the change in carrier mobility, thereby tending to make $T_{PHL}$ and $T_{PLH}$ constant with respect to temperature. Conversely, if the temperature decreases, the supply voltage $V_{supply}$ decreases proportionally to offset the change in carrier mobility, thereby tending to make $T_{PHL}$ and $T_{PLH}$ constant with respect to temperature.

In some embodiments, the supply voltage $V_{supply}$ varies inversely with respect to the square root of $\mu_N$ as a function of temperature. For example, if $V_{Supply}^2$ is inversely proportional to $\mu_N$ as a function of temperature (see equation 2 above), $T_{PHL}$ is substantially independent of temperature as shown by equations (4) and (5) below:

$$T_{PHL}/dT \sim \mu_N \times V_{supply}^2 \quad (4), \text{consequently}$$

$$T_{PHL}/dT \sim \mu_N \times 1/\mu_N \sim 1 \quad (5)$$

Therefore, as indicated by equations (4) and (5), when the adaptive voltage 308 in FIG. 3 supply varies the supply voltage $V_{supply}$ as $1/\text{sqrt}(\mu_N)$, $T_{PHL}$ will be independent of temperature.

The same applies to $T_{NHL}$, because $V_{Supply}$ can also be set to vary inversely proportion to square root of $\mu_p$:

$$T_{PLH}/dT \sim \mu_P \times V_{Supply}^2 \quad (6), \text{consequently}$$

$$T_{PLH}/dT \sim \mu_P \times 1/\mu_P \sim 1 \quad (7)$$

Thus, as indicated by equations (6) and (7), when the adaptive voltage supply 308 varies the supply voltage $V_{supply}$ as $1/\text{sqrt}(\mu_P)$, $T_{PHL}$ will be independent of temperature.

Since both $T_{PLH}$ and $T_{PHL}$ are independent of temperature when the supply voltage is varied in this manner, the oscillation frequency provided on the ring oscillator output 304 can be substantially constant over a wide temperature range. Therefore, by having an adaptive voltage supply 308 that varies a supply voltage $V_{supply}$ as a function of temperature, this disclosure enables ring oscillators that can provide an oscillation frequency that is substantially constant over a predetermined temperature range.

Figure 4:
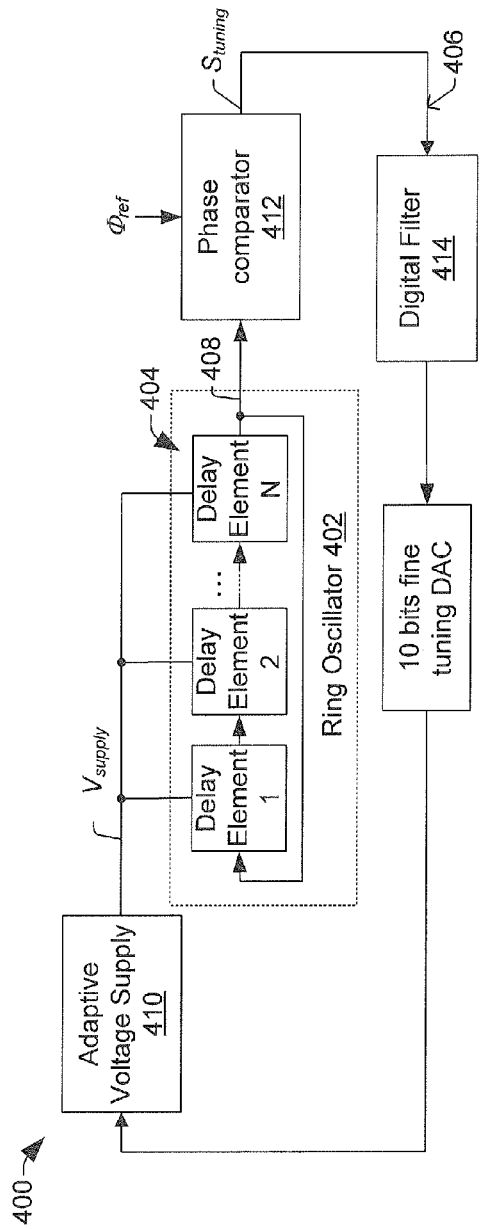
FIG. 4 is a block diagram illustrating a frequency generator in accordance with other embodiments.

FIG. 4 shows another embodiment of a frequency generator 400 including a ring oscillator 402 with N delay elements 404, where a feedback path 406 operably couples a ring oscillator output 408 to an adaptive voltage supply 410. Such a configuration may be useful in phase-locked-loops (PLL), especially digital PLLs with temperature compensated adaptive voltage supplies, and helps to ensure the ring oscillator 402 delivers an oscillation frequency that is substantially constant over temperature and process variation. In this embodiment, a phase (or frequency) comparator 412 provides a tuning signal, $S_{tuning}$, based on a difference, if any, between a fixed, reference phase (or frequency), $\Phi_{ref}$, and the phase of the oscillation signal provided on the ring oscillator output 408. A digital filter 414 filters the tuning signal, and a digital-to-analog converter provides a control signal (e.g., a 10 bit fine tuning signal) back to the adaptive voltage supply 410. The adaptive voltage supply 410 receives this signal and changes the level of the supply voltage $V_{supply}$ based thereon, thereby matching the phase (or frequency) of the oscillation signal with the reference signal over a predetermined temperature range.

For example, if the temperature increases (causing the carrier mobility to decrease), the oscillation frequency could briefly decrease if countermeasures were not taken. To counteract this, however, the feedback loop of the PLL adjusts the DAC signal upwards since the reference phase and the feedback phase are not aligned. For previous implementations, a drop in oscillation frequency is quite large for an uncompensated voltage controlled oscillator (e.g., ring oscillator) with temperature. However, in embodiments of the present invention, the adaptive voltage supply can adjust the supply voltage with temperature to help compensate for the drop in gain of the oscillator. This means that the DAC output can be maintained relatively constant with respect to temperature. Thus, the advantage of this configuration is the tuning range of the DAC will not need to account for temperature variations and can still maintain the same resolution, which is important for the PLL's performance in terms of jitter.

Figure 5:
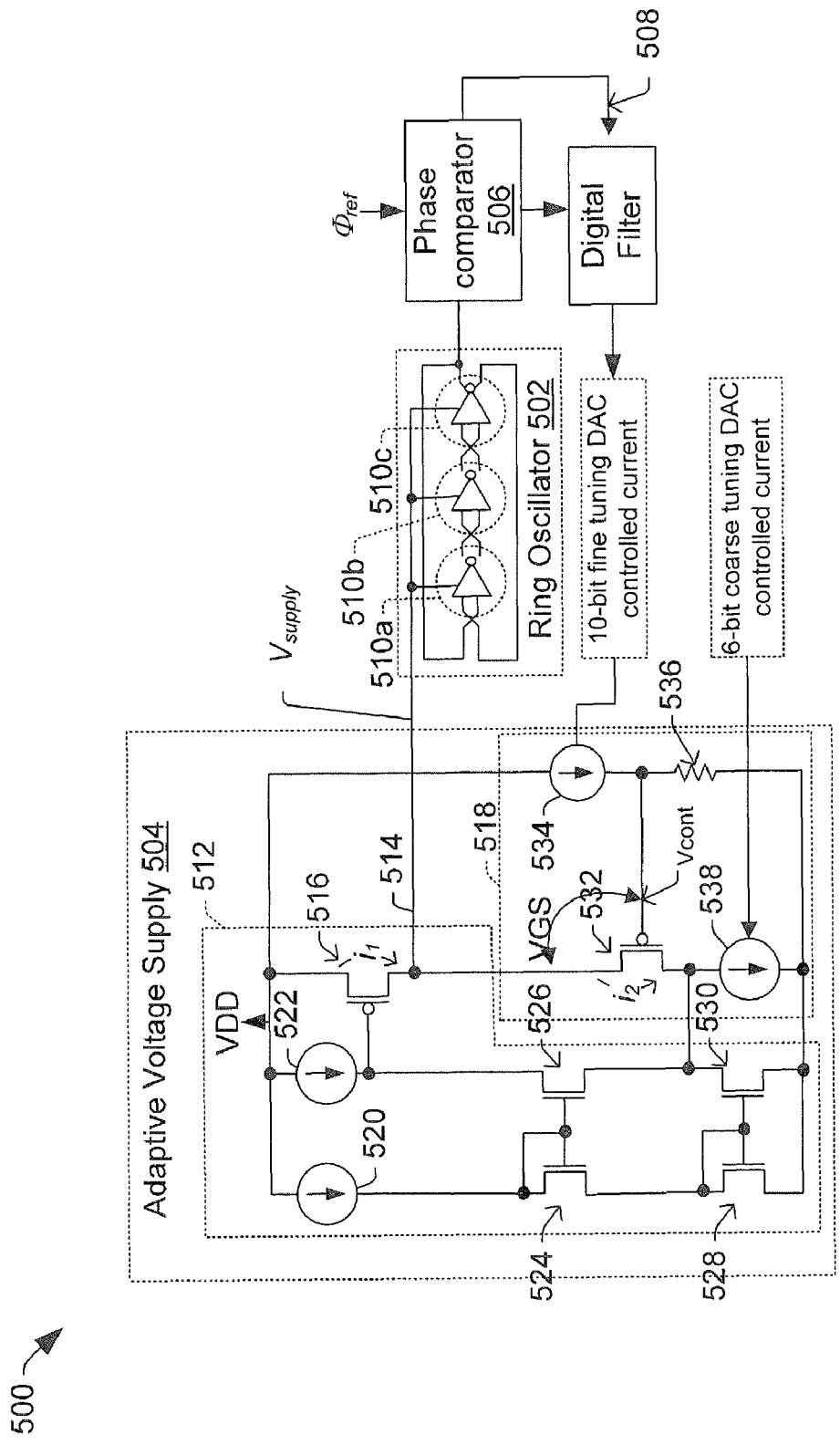
FIG. 5 is a block diagram illustrating a frequency generator in accordance with still other embodiments.

FIG. 5 shows another embodiment of a frequency generator 500 in accordance with some embodiments. This implementation again includes a ring oscillator 502, an adaptive voltage supply 504, and a phase comparator 506, which are operably coupled by a feedback path 508. The ring oscillator 502 again includes a series of delay elements (e.g., inverter 510a, inverter 510b, inverter 510c) that are chained together, wherein each delay element has a supply terminal operably coupled to an output node 514 of the adaptive voltage supply 504. Although the ring oscillator 502 is shown with only three delay elements, it will be appreciated that other ring oscillator embodiments could include any number of delay elements.

The adaptive voltage supply 504 includes a voltage regulator 512 having an output node 514 on which the supply voltage is provided. The voltage regulator 512 includes a first p-type transistor 516, which is coupled to the output node 514 and configured to deliver a first current, $i_1$, thereto. The first p-type transistor 516 works cooperatively with a current tuning element 518 that is also operably coupled to the output node 514. The current tuning element, which is important in setting the temperature dependent supply voltage, includes a second p-type transistor 532 and a temperature-dependent current source 534 (e.g., an n-type transistor).

During operation, the first p-type transistor 516 provides the first current, $i_1$, as a function of its gate voltage, which is set by current sources 520, 522 and transistors 524, 526, 528, 530 in the voltage regulator 512. This first current, $i_1$, flows into the second p-type transistor 532. The second p-type transistor 532 then delivers a second current $i_2$, which is a function of a gate voltage and biasing on the second p-type transistor 532. This gate voltage on the second p-type transistor is developed by an temperature-dependent current source 534 in series with a resistor 536. Notably, the gate-source voltage ($V_{GS}$) of the p-type transistor 532 reflects temperature effects on p-type devices, thereby compensating for oscillation frequency changes due to p-type devices in the ring oscillator 502; while the current generator 534 reflects temperature effects on n-type devices, thereby compensating for oscillation frequency changes due to n-type devices in the ring oscillator 502. In one embodiment, The 10-bit fine tuning current DAC can be biased by an NMOS current generator that has a PTAT current relationship with temperature, thus compensating the n-type devices in the ring oscillator. Consequently, the p-type transistor 532 and n-type transistor 534 cooperatively provide a suitable temperature dependent supply voltage $V_{supply}$. Thus, for example, when the temperature increases, $V_{supply}$ will correspondingly increase; and when the temperature decreases, $V_{supply}$ will correspondingly decrease.

In FIG. 5's embodiment, this temperature compensation scheme using transistors 532 and 534 is shown in the context of a PLL, however it will be appreciated that this transistor arrangement is also applicable to other systems. Nonetheless, in FIG. 5, the n-type transistor 534 is coupled to the feedback path 508 as shown. In one embodiment, a 10-bit value is supplied from the feedback path 508 to the n-type transistor 534 to achieve fine tuning of the supply voltage $V_{Supply}$ to lock the phase of the ring oscillator to the reference phase. For purposes of illustration, Table 1 below shows one example of how a 6-bit coarse tuning value can change to account for different process corners. The six course tuning signal is used during initial start-up to speed up the frequency acquisition in the PLL. Without the coarse tuning, the PLL will still work, although it will take much longer to initially ramp up.

TABLE 1

Coarse tuning at different process corners

| Process | Frequency (MHz) | 6-bit Coarse tuning |
|---|---|---|
| Typical-Typical | 200 | 000100 |
|  | 400 | 011110 |
| Fast NMOS, Fast PMOS | 200 | 000100 |
|  | 400 | 011110 |
| Slow NMOS, Slow PMOS | 200 | 000100 |
|  | 400 | 011110 |
| Fast NMOS, Slow PMOS | 200 | 000011 |
|  | 400 | 011010 |
| Slow NMOS, Fast PMOS | 200 | 001010 |
|  | 400 | 100111 |

Figure 6:
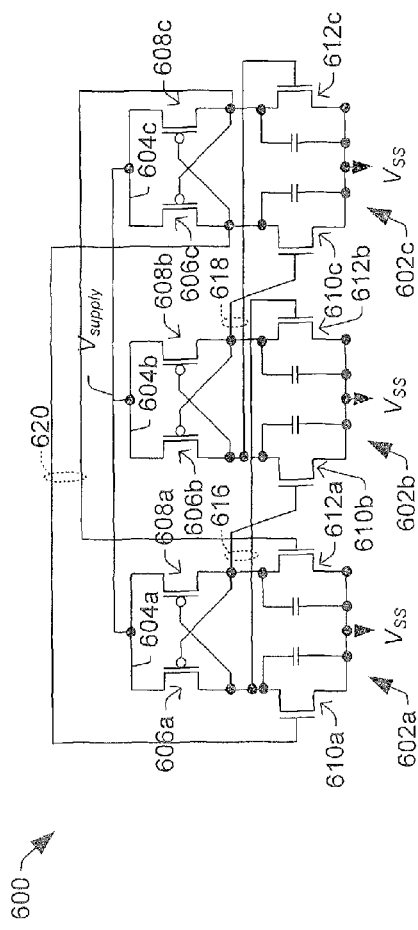
FIG. 6 is a circuit level schematic illustrating a ring oscillator in accordance with one embodiment.

Turning now to FIG. 6, one can see a circuit schematic of one example of a ring oscillator 600 made up of three delay elements (602a, 602b, 602c), each of which has a supply terminal (604a, 604b, 604c, respectively) that receives a supply voltage (e.g., supply voltage $V_{Supply}$ of FIG. 3, 4, or 5). Although this embodiment shows three delay elements, it will be appreciated that it could be extended to any number of delay elements.

Each delay element (e.g., 602a) includes a pair of PMOS transistors (e.g., 606a, 608a) having respective drains, respective sources, and respective gates; wherein the respective sources of the PMOS transistors are coupled to the adaptive voltage supply; and wherein the respective drains of the PMOS transistors are cross-coupled to the gates of the other PMOS transistors in the delay element. Each delay element (e.g., 602a) also includes a pair of NMOS transistors (e.g., 610a, 612a) having respect drains, respective sources, and respective gates; wherein the respective drains of the NMOS transistors are coupled to the respective drains of the PMOS transistors; and wherein the respective sources of the NMOS transistors are coupled to a source supply voltage ($V_{SS}$). An output 616 of the first delay element 602a is coupled to an input of the second delay element 602b, an output 618 of the second delay element 602b is coupled to an input of the last delay element 602c, and an output 620 of the last delay element 602c is coupled to an input of the first delay element 602a. In this way, the output of each delay element provides an oscillating voltage that oscillates at an oscillation frequency.

Figure 7:
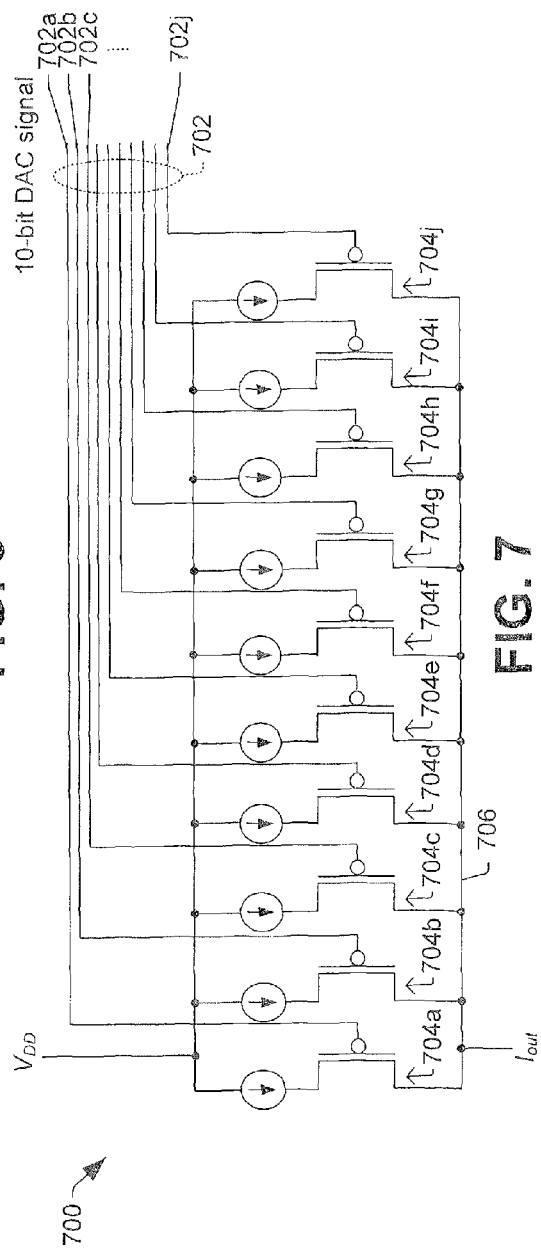
FIG. 7 is a circuit level schematic illustrating an adjustable current source in accordance with some embodiments

FIG. 7 shows an example of a 10-bit DAC controlled adjustable current source 700 (e.g., n-type transistor 534 of FIG. 5). The adjustable current source 700 includes a 10-bit bus 702 having bus lines 702a-702j, and current sources 704a-704j coupled to respective bus lines 702a-702j. During operation, respective bits are provided on the individual bus lines to selectively enable different combinations of current sources. A local current bus 706 sums the currents from the enabled current sources, thereby providing an output current $I_{out}$. It will be appreciated that other numbers of bits and current sources (i.e., greater than or less than 10 bits), could also be used in other implementations.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A frequency generator, comprising:
    a ring oscillator comprising a number of delay elements coupled in series with one another, wherein an output of a last of the delay elements is coupled to an input of a first of the delay elements and provides an oscillating voltage having an oscillation frequency and a phase;
    an adaptive voltage supply configured to provide a supply voltage to respective delay elements of the ring oscillator; and
    a phase comparator element configured to provide a tuning signal based on a difference, if any, between the phase of the oscillating voltage and a reference phase; wherein the adaptive voltage supply is configured to change the supply voltage in response to the tuning signal to limit variation in the oscillation frequency over a predetermined temperature range;
    wherein the adaptive voltage supply is configured to change the supply voltage inversely with the square root of mobility as a function of temperature in response to the tuning signal to limit variation in the oscillation frequency over a predetermined temperature range.

2. The frequency generator of claim 1, wherein the adaptive voltage supply is configured to vary the supply voltage inversely with carrier mobility as a function of temperature.

3. The frequency generator of claim 1, wherein the adaptive voltage supply is configured to increase the supply voltage if a temperature experienced by the ring oscillator is increased.

4. The frequency generator of claim 1, wherein the adaptive voltage supply is configured to decrease the supply voltage if a temperature experienced by the ring oscillator is decreased.

5. The frequency generator of claim 1, wherein a delay element of the ring oscillator comprises:
    a supply terminal configured to receive the supply voltage;

an input terminal on which an input signal having an input state is received; and an output terminal on which an output signal having an output state is provided, wherein the input state and output state are different during a cycle of input signal.

6. The frequency generator of claim 1, wherein the oscillation frequency remains between 340 MHz and 360 MHz over a temperature range of −40° C. to 130° C.

7. A frequency generator, comprising:
a ring oscillator comprising a number of delay elements coupled in series with one another, wherein an output of a last of the delay elements is coupled to an input of a first of the delay elements and provides an oscillating voltage having an oscillation frequency; and
an adaptive voltage supply configured to provide a supply voltage to respective delay elements of the ring oscillator; wherein the adaptive voltage supply is configured to vary the supply voltage over a temperature range to limit variations in the oscillation frequency over the temperature range;
wherein the adaptive voltage supply is configured to vary the supply voltage inversely with regards to the square root of a temperature-dependent carrier mobility over the temperature range.

8. A frequency generator, comprising:
a ring oscillator comprising a number of delay elements coupled in series with one another, wherein an output of a last of the delay elements is coupled to an input of a first of the delay elements and provides an oscillating voltage having an oscillation frequency; and
an adaptive voltage supply configured to provide a supply voltage to respective delay elements of the ring oscillator; wherein the adaptive voltage supply is configured to vary the supply voltage over a temperature range to limit variations in the oscillation frequency over the temperature range;
wherein the adaptive voltage supply comprises:
a first p-type transistor operably coupled to an output node of the adaptive voltage supply and configured to deliver a current thereto; and
a current tuning element operably coupled to the output node and configured to drain a tunable current there from, whereby the first p-type transistor and the current tuning element cooperatively set the supply voltage as a function of the current and the tunable current; and
wherein the current tuning element comprises:
a second p-type transistor coupled to the output node and configured to drain a current there from; and
a current generator that tracks a temperature dependent n-type transistor, wherein a gate voltage for the first p-type transistor is developed by the current generator.

9. The frequency generator of claim 8, further comprising:
a feedback path that operably couples an output of the ring oscillator to the current tuning element, wherein the feedback path provides a tuning signal indicative of a difference, if any, between a phase of the oscillating voltage provided by the ring oscillator and a reference phase.

10. A frequency generator, comprising:
a ring oscillator comprising a number of delay elements coupled in series with one another, wherein an output of a last of the delay elements is coupled to an input of a first of the delay elements and provides an oscillating voltage having an oscillation frequency and a phase;
an adaptive voltage supply configured to provide a supply voltage to respective delay elements of the ring oscillator; and
a phase comparator element configured to provide a tuning signal based on a difference, if any, between the phase of the oscillating voltage and a reference phase;
wherein the adaptive voltage supply comprises:
a first p-type transistor operably coupled to an output node of the adaptive voltage supply and configured to deliver a current thereto; and
a current tuning element operably coupled to the output node and configured to drain a tunable current there from, whereby the first p-type transistor and the current tuning element cooperatively set the supply voltage as a function of the current and the tunable current;
a second p-type transistor coupled to the output node and configured to drain a current there from; and
a current generator that tracks a temperature dependent n-type transistor, wherein a gate voltage for the first p-type transistor is developed by the current generator.

* * * * *